(12) United States Patent
Lai et al.

(10) Patent No.: US 12,264,249 B2
(45) Date of Patent: Apr. 1, 2025

(54) CURABLE COMPOSITION FOR INKJET, CURED PRODUCT AND FLEXIBLE PRINTED CIRCUIT BOARD

(71) Applicant: Microcosm Technology Co., Ltd., Tainan (TW)

(72) Inventors: Bo-Hung Lai, Tainan (TW); Yu-Chiao Shih, Tainan (TW); Tang-Chieh Huang, Tainan (TW)

(73) Assignee: Microcosm Technology Co., Ltd., Tainan (TW)

( * ) Notice: Subject to any disclaimer, the term of this patent is extended or adjusted under 35 U.S.C. 154(b) by 389 days.

(21) Appl. No.: 17/798,314

(22) PCT Filed: Oct. 20, 2020

(86) PCT No.: PCT/CN2020/122151
§ 371 (c)(1),
(2) Date: Aug. 9, 2022

(87) PCT Pub. No.: WO2022/082425
PCT Pub. Date: Apr. 28, 2022

(65) Prior Publication Data
US 2023/0091093 A1    Mar. 23, 2023

(51) Int. Cl.
| | | |
|---|---|---|
| *C09D 11/101* | (2014.01) | |
| *B41J 2/01* | (2006.01) | |
| *C09D 11/102* | (2014.01) | |
| *C09D 11/30* | (2014.01) | |
| *C09D 11/38* | (2014.01) | |
| *C09D 11/52* | (2014.01) | |
| *H05K 1/03* | (2006.01) | |
| *H05K 1/09* | (2006.01) | |

(52) U.S. Cl.
CPC ............. *C09D 11/101* (2013.01); *B41J 2/01* (2013.01); *C09D 11/102* (2013.01); *C09D 11/30* (2013.01); *C09D 11/38* (2013.01); *C09D 11/52* (2013.01); *H05K 1/0393* (2013.01); *H05K 1/092* (2013.01)

(58) Field of Classification Search
CPC ............ B41J 2/01; B41J 2/211; B41J 2/1433; B41J 2/17; B41J 2/17593; B41J 2/2107; B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; B41J 25/001; B41J 25/34; B41J 25/003; B41J 25/312; B41J 2025/008; B41J 2202/21; B41J 2/17596; B41J 2/16508; B41J 2/1652; B41J 2/175; B41J 2/17563; B41M 5/0011; B41M 5/0017; B41M 5/0023; B41M 5/0047; B41M 7/00; B41M 7/0072; B41M 5/52; B41M 5/5218; B41M 5/5227; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; C09D 11/106; C09D 11/326; C09D 11/107; C09D 11/03; C09D 11/037; C09D 11/033
See application file for complete search history.

(56) References Cited

U.S. PATENT DOCUMENTS

| | | | |
|---|---|---|---|
| 8,349,537 B2 | 1/2013 | Win et al. | |
| 8,420,770 B2 | 4/2013 | Furuta et al. | |
| 2010/0121013 A1* | 5/2010 | Sakita | B82Y 10/00 264/447 |
| 2010/0133728 A1* | 6/2010 | Yonezawa | G03F 7/0002 522/182 |
| 2012/0000696 A1 | 1/2012 | Hall et al. | |
| 2013/0095254 A1* | 4/2013 | Ageishi | C09D 11/30 427/256 |
| 2014/0290990 A1* | 10/2014 | Shimura | H05K 3/287 522/183 |
| 2018/0230270 A1* | 8/2018 | Lai | C09D 179/08 |
| 2019/0300739 A1* | 10/2019 | Torfs | C09D 11/037 |

FOREIGN PATENT DOCUMENTS

| | | |
|---|---|---|
| CN | 101807001 | 8/2010 |
| CN | 102585607 | 7/2012 |
| CN | 102762621 | 10/2012 |
| CN | 103145988 | 6/2013 |
| CN | 105085911 | 11/2015 |
| CN | 106893101 | 6/2017 |
| CN | 108884345 | 11/2018 |

(Continued)

OTHER PUBLICATIONS

"Office Action of China Counterpart Application", issued on Dec. 5, 2022, p. 1-p. 12.
"International Search Report (Form PCT/ISA/210) of PCT/CN2020/122151", with English translation thereof, mailed on Jul. 21, 2021, pp. 1-6.

*Primary Examiner* — Manish S Shah
(74) *Attorney, Agent, or Firm* — JCIPRNET

(57) ABSTRACT

The invention provides a curable composition for inkjet, a cured product, and a flexible printed circuit board. The curable composition for inkjet includes a soluble polyimide resin, a photocurable acrylate compound, a photopolymerization initiator, and a thermosetting resin. The curable composition for inkjet has excellent flexibility, and has a withstand voltage of greater than 2 kV even when the thickness is less than 20 μm.

10 Claims, No Drawings

(56) References Cited

FOREIGN PATENT DOCUMENTS

| | | |
|---|---:|---:|
| CN | 109270792 | 1/2019 |
| CN | 109337437 | 2/2019 |
| CN | 109689803 | 4/2019 |
| CN | 109814336 | 5/2019 |
| CN | 110431483 | 11/2019 |
| CN | 110582546 | 12/2019 |
| CN | 111154327 | 5/2020 |
| EP | 2657307 | 10/2013 |
| JP | 2015110765 | 6/2015 |
| TW | 575636 | 2/2004 |
| TW | I504694 | 10/2015 |
| WO | 2007020644 | 2/2007 |

\* cited by examiner

CURABLE COMPOSITION FOR INKJET, CURED PRODUCT AND FLEXIBLE PRINTED CIRCUIT BOARD

CROSS-REFERENCE TO RELATED APPLICATION

This application is a 371 application of the international PCT application serial no. PCT/CN2020/122151, filed on Oct. 20, 2020. The entirety of the above-mentioned patent application is hereby incorporated by reference herein and made a part of this specification.

BACKGROUND OF THE INVENTION

Field of the Invention

The invention relates to a cured composition for a flexible printed circuit board, and particularly relates to a UV curable composition used by an inkjet method, a resist and a cured coating film for a flexible printed circuit board marked and etched using the same, and a flexible printed circuit board having a pattern obtained by using the same.

Description of Related Art

In the production process of flexible printed circuit boards, in order to protect the metal circuit from oxidation and corrosion, generally, a cover film is attached to the surface of the circuit board to protect the circuit, or a photocurable/thermocurable resin composition is coated on the circuit board and then exposed and developed on the circuit to be cured into a flexible film, wherein a curable composition is more suitable for use.

In the curable composition above, it is necessary to ensure the adhesion to both a plastic substrate mainly composed of polyimide, etc. and the conductive circuit metal provided thereon, ensure solder heat resistance while maintaining adhesion, reduce the withstand voltage of the protective layer, etc. However, due to the lack of flexibility, the coating film formed by the general photocurable composition may not readily achieve excellent adhesion to both the circuit metal and the plastic substrate, and after thinning, better withstand voltage characteristics may not be obtained due to material properties.

SUMMARY OF THE INVENTION

In order to solve the above issues of the prior art, the main object of the invention is to provide a curable composition for inkjet, which is excellent in flexibility, has excellent withstand voltage properties after thinning, and may maintain solder heat resistance and properties of, for example, plastic substrates and conductive layers.

Another object of the invention is to form a patterned coating film by an inkjet method, so as to reduce the use of materials, thereby reducing waste liquid generated by the lithography process.

The curable composition for inkjet of the invention includes a soluble polyimide resin, a photocurable acrylate compound, a photopolymerization initiator, and a thermosetting resin. The photocurable acrylate compound includes a difunctional (meth)acrylate compound containing an alkylene chain or an alkoxy chain, a bisphenol epoxy (meth)acrylate compound, and a (meth)acrylate compound having a hydroxyl group. The soluble polyimide resin is dissolved in the difunctional (meth)acrylate compound containing the alkylene chain or the alkoxy chain.

In an embodiment of the invention, an intrinsic viscosity of the soluble polyimide resin is 0.1 to 0.8.

In an embodiment of the invention, the soluble polyimide resin is polymerized from a dianhydride monomer and a diamine monomer having a molar ratio of 1:0.9 to 1:0.98.

In an embodiment of the invention, a viscosity of the curable composition for inkjet at a temperature of 50° C. is 50 mPa·s or less.

In an embodiment of the invention, a solid content of the soluble polyimide resin dissolved in the difunctional (meth)acrylate compound containing the alkylene chain or the alkoxy chain is 1 wt % to 40 wt % of the difunctional (meth)acrylate compound containing the alkylene chain or the alkoxy chain.

In an embodiment of the invention, the soluble polyimide resin is composed of a monomer represented by a chemical structure of formula 1 and a fluorine-containing monomer,

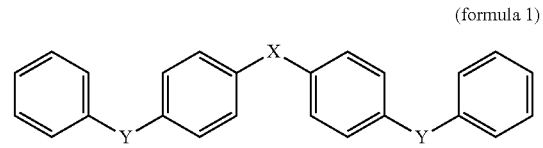

(formula 1)

in formula 1, X is $SO_2$, $C(CH_3)_2$, or $C(CF_3)_2$, and Y is an oxygen atom.

In an embodiment of the invention, the fluorine-containing monomer includes 4,4'-(hexafluoroisopropylidene)diphthalic anhydride (6FDA), bis(trifluoromethyl)benzidine (TFMB), 2,2'-bis(3-aminophenyl)hexafluoropropane (33-6F), 2,2'-bis(4-aminophenyl)hexafluoropropane (44-6F), 2,2-bis(3-amino-4-hydroxy-phenyl)-hexafluoropropane (bis-APAF), or 2,2'-bis(trifluoromethyl)-4,4'-diaminodiphenyl ether (6FODA).

In an embodiment of the invention, the monomer represented by the chemical structure of formula 1 and the fluorine-containing monomer account for 50% or more of total moles of a dianhydride monomer and a diamine monomer.

The invention provides a cured product obtained by curing the above curable composition for inkjet.

The invention provides a flexible printed circuit board, including the cured product.

In an embodiment of the invention, a thickness of the cured product located at a surface of the flexible printed circuit board is 15 μm, and the cured product has no cracks after bending at an angle of R=3 mm and 10,000 times of bending tests.

Based on the above, the curable composition for inkjet of the invention includes a soluble polyimide resin, a photocurable acrylate compound, a photopolymerization initiator, and a thermosetting resin. The photocurable acrylate compound includes a difunctional (meth)acrylate compound containing an alkylene chain or an alkoxy chain. The soluble polyimide resin is dissolved in the difunctional (meth)acrylate compound containing the alkylene chain or the alkoxy chain.

Therefore, the curable composition for inkjet of the invention is excellent in flexibility, has excellent withstand voltage characteristics after thinning, and may maintain solder heat resistance and properties of, for example, plastic substrates and conductive layers.

DESCRIPTION OF THE EMBODIMENTS

The curable composition for inkjet of the invention includes: (A) soluble polyimide resin, (B) photocurable acrylate compound, (C) photopolymerization initiator, and (D) thermosetting resin. The photocurable acrylate compound includes a difunctional (meth)acrylate compound containing an alkylene chain or an alkoxy chain, a bisphenol epoxy (meth)acrylate compound, and a (meth)acrylate compound having a hydroxyl group.

(A) Soluble Polyimide Resin

The soluble polyimide is formed by reacting diamine and tetracarboxylic dianhydride via a chemical infinite cycle or a one-step infinite cycle, and is soluble in the difunctional (meth)acrylate compound containing the alkylene chain or the alkoxy chain. The difunctional (meth)acrylate compound containing the alkylene chain may be di(meth)acrylate of glycol such as ethylene glycol di(meth)acrylate, 1,4-butanediol di(meth)acrylate, 1,3-butanediol di(meth)acrylate, 1,6-hexanediol di(meth)acrylate, 1,9-nanediol di(meth)acrylate, 1,10-decanediol di(meth)acrylate, neopentyl glycol di(meth)acrylate, glycerol di(meth)acrylate, tricyclodecane dimethanol di(meth)acrylate, polyalkylene glycol (80) di(meth)acrylate, polyalkylene glycol (100) di(meth)acrylate, polyalkylene glycol (150) di(meth)acrylate. The difunctional (meth)acrylate compound containing the alkoxy chain may be diethylene glycol di(meth)acrylate, triethylene glycol di(meth)acrylate, propoxylated neopentyl glycol di(meth)acrylate (2), polyethylene glycol (200) di(meth)acrylate, polyethylene glycol (400) di(meth)acrylate, bisphenol A ethoxylate di(meth)acrylate (2), bisphenol A ethoxylate di(meth)acrylate (4), bisphenol A ethoxylate di(meth)acrylate (10), bisphenol A ethoxylate di(meth)acrylate (30). The soluble polyimide resin is soluble in any one or a combination of two or more (meth)acrylic acids of the difunctional (meth)acrylate compound containing the alkylene chain or the alkoxy chain, and the solid content is usually 1 wt % to 40 wt %, more preferably 5 wt % to 20 wt %, of the difunctional (meth)acrylate compound containing the alkylene chain or the alkoxy chain.

The soluble polyimide resin, for example, is composed of a monomer represented by the chemical structure of formula 1 and a fluorine-containing monomer,

(formula 1)

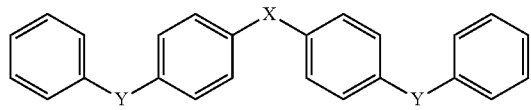

in formula 1, X is $SO_2$, $C(CH_3)_2$, or $C(CF_3)_2$, and Y is an oxygen atom.

The monomer represented by the chemical structure of formula 1 may be 4,4'-(4,4'-isopropylidenediphenoxy)bis(phthalic anhydride) (BPADA), 4,4'-(4,4'-hexafluoroIsopropylidenediphenoxy)bis(phthalic anhydride) (HFBPADA), 4,4-bis(3,4-dicarboxyphenoxy)diphenyl sulfide dianhydride (BDSDA), 2,2'-bis[4(4-aminophenoxy)phenyl]hexafluoropropane (4BDAF), 2,2-bis[4-(4-aminophenoxy)-phenyl]propane (BAPP), 4,4'-bis(3-amino phenoxy)diphenyl sulfone (BAPS); the fluorine-containing monomer may be 4,4'-(hexafluoroisopropylidene)diphthalic anhydride (6FDA), bis(trifluoromethyl)benzidine (TFMB), 2,2'-bis(3-aminophenyl)hexafluoropropane (33-6F), 2,2'-bis(4-aminophenyl)hexafluoropropane (44-6F), 2,2-bis(3-amino-4-hydroxy-phenyl)-hexafluoropropane (bis-APAF), 2,2'-bis(trifluoromethyl)-4,4'-diaminodiphenyl ether (6FODA).

In the present embodiment, the tetracarboxylic dianhydride may be selected from biphenyl-tetracarboxylic acid dianhydride (BPDA), 4-(2,5-dioxytetrahydrofuran-3-yl)-1,2,3,4-tetrahydronaphthalene-1,2-dicarboxylic acid anhydride (TDA), 3,3,4,4-benzophenone tetracarboxylic dianhydride (BTDA), 4,4-oxydiphthalic dianhydride (ODPA), bis(3,4dicarboxyphenyl)dimethyl-silane dianhydride (SiDA), sulfonyldiphthalic anhydride ($SO_2$DPA), cyclobutane-1,2,3,4-tetracarboxylic dianhydride (CBDA), bicyclo[2.2.2]oct-7-ene-2,3,5,6-tetracarboxylic acid dianhydride (B1317), 1,4-bis(3,4-dicarboxyphenoxy)phthalic anhydride (HQDEA), 4,4'-bis(3,4-dicarboxyphenoxy)biphenyl dianhydride, 2,2-bis[4-(3,4-dicarboxyphenoxy)phenyl]propanedianhydride, 4,4-(hexafluoroisopropylidene)diphthalic anhydride (BPADA), ethylene glycol bis (trimellitic anhydride) (TMEG), propylene glycol bis(trimellitic anhydride) (TMPG), 1,2-propanediol bis(trimellitic anhydride), butanediol bis(trimellitic anhydride), 2-methyl-1,3-propanediol bis(trimellitic anhydride), dipropylene glycol bis(trimellitic anhydride), 2-methyl-2,4-pentanediol bis(trimellitic anhydride), diethylene glycol bis(trimellitic anhydride), tetraethylene glycol bis(trimellitic anhydride), hexaethylene glycol bis(trimellitic anhydride), neopentyl glycol bis(trimellitic anhydride), hydroquinone bis(trimellitic anhydride) (TAHQ), hydroquinone bis(2-hydroxyethyl) ether bis(trimellitic anhydride), 2-phenyl-5-(2,4-diyl)-1,4-hydroquinonebis(trimellitic anhydride), 2,3-dicyanohydroquinonecyclobutane-1,2,3,4-tetracarboxylic dianhydride, 1,2,3,4-cyclopentanetetracarboxylic dianhydride (CPDA), 1,2,4,5-cyclohexanetetracarboxylic dianhydride (CHDA), bicyclo[2.2.1]heptane-2,3,5,6-tetracarboxylic dianhydride (BHDA), bicyclo[2.2.2]oct-7-ene-2,3,5,6-tetracarboxylic dianhydride (BOTDA), bicyclo[2.2.2]octane-2,3,5,6-tetracarboxylic dianhydride (BODA), 2,3,5-tricarboxy-cyclopentylacetic dianhydride, bicyclo[2.2.1]heptane-2,3,5-tricarboxy-6-acetic dianhydride, decahydro-1,4,5,8-dimethanolnaphthalene-2,3,6,7-tetracarboxylic dianhydride, butan-1,2,3,4-tetracarboxylic dianhydride, 3,3',4,4'-dicyclohexyltetracarboxylic dianhydride, and 1,2,4,5-cyclohexanetetracarboxylic dianhydride (HPMDA), but is not limited thereto; the diamine may be selected from 4,4'-oxydianiline (ODA), para-methylene dianiline (pMDA), meta-methylene dianiline (mMDA), 1,3-bis(3-aminophenoxy)benzene (133 APB), 1,3-bis(4-aminophenoxy)benzene (134APB), bis(4-aminophenyl)sulfone (4DDS), bis(3-aminophenyl)sulfone (3DDS), 1,3-cyclohexanediamine (13 CHD), 1,4-cyclohexanediamine (14CHD), (9,9-bis(4-aminophenyl)fluorene (FDA), 9,9-bis(3-fluoro-4-aminophenyl)fluorene (FFDA), 2,2-bis(3-aminophenyl)-1,1,1,3,3,3-hexafluoropropane (BAPP), 2,2-bis(4-aminophenyl)hexafluoropropane (APHF), 2,2'-bis(trifluoromethyl)benzidine (TFMB), 2,2'-dimethylbenzidine (m-tolidine), 1,3-bis(3-aminophenoxy)benzene (TPE-M), 1,3-bis(4-aminophenoxy)benzene (TPE-R), 1,4-bis(3-aminophenoxy)benzene, 1,4-bis(4-aminophenoxy)benzene (TPE-Q), 5-amino-2-(p-aminophenyl)benzoxazole (5-ABO), and 6-ABO, but is not limited thereto.

Preferably, the monomer represented by the chemical structure of formula 1 and the fluorine-containing monomer account for 50% or more of the total moles of polyimide dianhydride and diamine. The intrinsic viscosity of the soluble polyimide resin is, for example, between 0.1 and 0.8. The soluble polyimide resin is polymerized from a dianhydride monomer and a diamine monomer in a molar ratio of 1:0.9 to 1:0.98.

(B) Photocurable Acrylate Compound

In the curable composition for inkjet of the invention, the photocurable acrylate compound may include a difunctional (meth)acrylate compound containing an alkylene chain or an alkoxy chain, a bisphenol epoxy (meth)acrylate compound, and a (meth)acrylate compound having a hydroxyl group.

It is preferable that the difunctional (meth)acrylate compound containing the alkylene chain or the alkoxy chain does not have a hydroxyl group. Via the difunctional (meth)acrylate compound containing the alkylene chain or the alkoxy chain, any one or a combination of two or more (meth)acrylic acids, a low-viscosity composition suitable for inkjet printing may be obtained. Specific examples of the difunctional (meth)acrylate compound containing the alkylene chain may include, for example: di(meth)acrylate of glycol such as ethylene glycol di(meth)acrylate, 3-methyl-1,5-pentanediol di(meth)acrylate, 1,4-butanediol di(meth)acrylate, 1,3-butanediol di(meth)acrylate, 1,6-hexanediol di(meth)acrylate, 1,9-nanediol di(meth)acrylate, 1,10-decanediol di(meth)acrylate, neopentyl glycol di(meth)acrylate, glycerol di(meth)acrylate, tricyclodecane dimethanol di(meth)acrylate, polyalkylene glycol (80) di(meth)acrylate, polyalkylene glycol di(meth)acrylate. Specific examples of the difunctional (meth)acrylate compound containing the alkoxy chain may include, for example: diethylene glycol di(meth)acrylate, triethylene glycol di(meth)acrylate, neopentyl glycol propoxylated di(meth)acrylate (2), polyethylene glycol di(meth)acrylate, polypropylene glycol di(meth)acrylate, polybutylene glycol di(meth)acrylate, polypentylene glycol di(meth)acrylate, bisphenol A ethoxylate di(meth)acrylate (2), bisphenol A ethoxylate di(meth)acrylate (4), bisphenol A ethoxylate di(meth)acrylate (10), bisphenol A ethoxylate di(meth)acrylate (30). Commercially-available products of the difunctional (meth)acrylate compound containing the alkylene chain or the alkoxy chain may include, for example: NK ESTER A-NOD-N (names of products made by Shin Nakamura Chemical Industry Co.), LIGHT ACRYLATE 3EG-A 4EG-A 9EG-A 14EG-A PTMGA-250 NP-A MPD-A, 1,6HX-A, 1,9ND-A, BP-4PA (names of products made by Kyoeisha Chemical Co., Ltd.), HDDA, 1,9-NDA (names of products made by DAICEL-ALLNEX), EGDMA, DEGDMA, 3EGDMA, NPGDMA, EP80DMA, E2BADMA, E2BADMA (names of products made by Shirakawa Chemical Co., Ltd.) DM BPA(2EO)DMA, DM BPA(2EO)DMA, DM NPG(2PO)DA, DM PEG(200)DA, DM PEG(200)DMA, DM PEG(400)DA, DM PEG(600)DA (names of products made by Double Bond Chemical).

In 100 parts by mass of the curable composition for inkjet, the blending amount of the difunctional (meth)acrylate compound containing the alkylene chain or the alkoxy chain is preferably 20 parts by mass to 90 parts by mass, more preferably 40 parts by mass to 80 parts by mass. When the blending amount of the difunctional (meth)acrylate compound containing the alkylene chain or the alkoxy chain is 20 parts by mass or more, the compatibility of the ink is good. Moreover, when the blending amount of the difunctional (meth)acrylate compound containing the alkylene chain or the alkoxy chain is 90 parts by mass or less, the adhesion of the ink is good.

The viscosity of the difunctional (meth)acrylate compound containing the alkylene chain or the alkoxy chain at a temperature of 25° C. is 5 mPa·s to 50 mPa·s, and in particular 5 mPa·s to 30 mPa·s is better. In this viscosity range, the difunctional (meth)acrylate compound containing the alkylene chain or the alkoxy chain as a diluent has good operability, and the components may be mixed uniformly. Therefore, the adhesion of the coating film to the substrate is also good.

The bisphenol epoxy (meth)acrylate compound is used to increase the toughness of the coating film, the adhesion to the substrate and characteristics such as synergy, stability, compatibility, leveling, defoaming of the ink. A bisphenol epoxy compound is partially added to a (meth)acrylic acid compound to increase the heat resistance, chemical resistance, hardness, adhesion, abrasion resistance, etc. of the coating film, and specifically, examples may include EA-1010N (Shin Nakamura Chemical) DM127-100, DM127-TP20, DM1283C, DM129, DM1700, DM1701, DM1703, DM1730, DM176-TF, DM186, DM188, DM193A-TF, DM193-TP50 (DBC), MIRAIVIER PE210, PE250, PE110H, PE230, PE310, EA2235, EA2259, EA2280, ME2110 (Miwon), Genomer 2235, 2252, 2253, 2255, 2259, 2263, 2280, 2281, 2312 (RAHN), PHOTOMER 3005, 3016, 3052, 3072, 3316, 3318, 3319 (IGM), and corresponding products to the above with similar structures. In particular, in terms of the ease of adjustment of the above acrylic viscosity, a monofunctional (meth)acrylate compound is preferably used as the diluent thereof. The bisphenol epoxy (meth)acrylate compound may be used alone or in combination of two or more.

In 100 parts by mass of the curable composition for inkjet, the blending ratio of the bisphenol epoxy (meth)acrylate compound is preferably 5 parts by mass to 30 parts by mass. By including the bisphenol epoxy (meth)acrylate compound, a low-viscosity composition suitable for inkjet coating and having good various properties may be obtained.

As the (meth)acrylate compound having the hydroxyl group, a low molecular weight material such as a monomer or an oligomer may be used. Specifically, a material having a molecular weight of 100 to 1000, preferably a molecular weight of 110 to 700, may be used.

Specific examples of the (meth)acrylate compound having the hydroxyl group may include, for example: propiolactone (meth)acrylate, butyrolactone (meth)acrylate, caprolactone (meth)acrylate, valerolactone (meth)acrylate, 2-hydroxy-3-acryloyloxypropyl (meth)acrylate, 2-hydroxy-3-phenoxyethyl (meth)acrylate, 1,4-cyclohexanedimethanol mono(meth)acrylate, 2-hydroxyethyl (meth)acrylate, 2-hydroxypropyl (meth)acrylate, 4-hydroxybutyl (meth)acrylate, pentaerythritol tri(meth)acrylate, dipentaerythritol monohydroxypenta(meth)acrylate, 2-hydroxypropyl (meth)acrylate, or hydroxyl (meth)acrylate obtained by the ring-opening of glycidyl ether (meth)acrylate, and specific examples of the glycidyl ether may include, for example: glycidyl methacrylate, 4-hydroxybutyl acrylate glycidyl ether. As the hydroxyl (meth)acrylate compound, one or a combination of two or more (meth)acrylates may be used.

Commercially-available products of the (meth)acrylate compound having the hydroxyl group may include, for example: MIRAER M100, M1051 (MIWON), ARONIX M-5700 (Toagosei), 4HBA, 2HEA, CHDMMA (Nippon Kasei), BHEA, HPA, HEMA, HPMA (Nippon Shokubai), Light ester HO, Light ester HOP, Light ester HOA (Kyoeisha Chemical).

The (meth)acrylate compound having the hydroxyl group may be used in combination of one or more. In particular, 2-hydroxy-3-acryloyloxypropyl acrylate, 2-hydroxy-3-phenoxyethyl acrylate, 2-hydroxyethyl acrylate, 2-hydroxypropyl acrylate, 4-hydroxybutyl acrylate, 1,4-cyclohexanedimethanol monoacrylate are particularly preferred. Moreover, in terms of ease of viscosity adjustment, a monofunctional (meth)acrylate compound is preferred.

In 100 parts by mass of the curable composition for inkjet, the blending amount of the (meth)acrylate compound having the hydroxyl group is preferably 1 part by mass to 20 parts by mass, more preferably 2 parts by mass to 10 parts by mass. When the blending amount of the (meth)acrylate compound having the hydroxyl group is 1 part by mass or more, the adhesion of the composition is more favorable. Moreover, when the blending amount is 20 parts by mass or less, the decrease in ink compatibility may be suppressed.

For the object of adjusting the viscosity of the ink composition, in addition to the (meth)acrylate compound, the curable composition for inkjet of the invention may be suitably blended with a diluent. The diluent may include, for example: a diluting solvent, photoreactive diluent, thermally reactive diluent, and a photoreactive diluent is preferred, for example. The photoreactive diluent may include, for example: an unsaturated double bond or a compound having an oxetanyl group or an epoxy group such as (meth)acrylate, vinyl ether, ethylene derivative, styrene, chloromethyl styrene, α-methyl styrene, maleic anhydride, dicyclopentadiene, N-vinylpyrrolidone, N-vinylformamide, xylylene dioxetane, oxetanol, 3-ethyl-3-(phenoxymethyl)oxetane, resorcinol diglycidyl ether, and is preferably, for example, (meth)acrylate, and is more preferably, for example, monofunctional (meth)acrylate and difunctional (meth)acrylate. The monofunctional (meth)acrylate may include, for example: (meth)acrylate or acryloylmorpholine such as methyl (meth)acrylic acid, methyl (meth)acrylate, ethyl (meth)acrylate, propyl (meth)acrylate, butyl (meth)acrylate, isobutyl (meth)acrylate, isooctyl (meth)acrylate, isobutyl (meth)acrylate, lauryl (meth)acrylate, stearyl (meth)acrylate, cyclohexyl (meth)acrylate, isobornyl (meth)acrylate, adamantyl mono(meth)acrylate, glycidyl (meth)acrylate, tetrahydrofurfuryl acrylate, benzyl (meth)acrylate, phenoxy (meth)acrylate, polyoxyalkylene-modified (meth)acrylate, lactone-modified (meth)acrylate with polylactone structure, 2-hydroxyethyl (meth)acrylate, hydroxypropyl (meth)acrylate, hydroxybutyl (meth)acrylate, glycidyl methacrylate; the difunctional (meth)acrylate may include, for example: ethylene glycol di(meth)acrylate, propylene glycol di(meth)acrylate, butanediol di(meth)acrylate, hexanediol di(meth)acrylate, neopentyl glycol di(meth)acrylate, norbornane di(meth)acrylate, norbornane dimethanol di(meth)acrylate, dicyclopentyl di(meth)acrylate, tricyclodecane dimethanol diethanol di(meth)acrylate, dipropylene glycol di(meth)acrylate, tripropylene glycol di(meth)acrylate, polyoxyethylene chain di(meth)acrylate, polyoxypropylene chain di(meth)acrylate, lactone-modified di(meth)acrylate with polylactone structure.

For the object of improving the hardness and crosslinking degree of the ink composition after UV curing, the curable composition for inkjet is blended with a trifunctional or higher (meth)acrylate compound (except for those having a hydroxyl group). The trifunctional or higher (meth)acrylate compound may include, for example: trimethylolpropane tri(meth)acrylate, trimethylolmethane tri(meth)acrylate, ethylene oxide-modified trimethylolpropane tri(meth)acrylate, propylene oxide-modified trimethylolpropane tri(meth)acrylate, epichlorohydrin-modified trimethylolpropane tri(meth)acrylate, pentaerythritol tetra(meth)acrylate, tetramethylolmethane tetrapropyl(meth)enoate, ethylene oxide-modified phosphoric acid tri(meth)acrylate, propylene oxide-modified phosphoric acid tri(meth)acrylate, epichlorohydrin-modified glycerol tri(meth)acrylate, dipentaerythritol hexa(meth)acrylate, ditrimethylolpropane tetra(meth)acrylate, or polyfunctional (meth)acrylate represented by such silsesquioxane modifiers, or (meth)acrylate monomer or ε caprolactone-modified acryloyloxyethyl isocyanurate corresponding to the above.

In order to improve the adhesion of the ink composition after UV curing, the wetting of the colorant, and increase toughness, the curable composition for inkjet may be blended with a polyester (meth)acrylate compound. Examples may include, for example: SETAL 91715 SS-55 (Allnex), CN2203NS, CN2254NS, CN2261, CN2262, CN2302, CN2303, CN7001NS, CN704, CN750, CN790, CN8200NS, CN8201NS, PRO31090NS, PRO31070NS, PRO31156NS (Sartomer), DM270, DM272, DM2732, DM285, DM286, DM287, DM623 (DBC), Miramer SIU900, SC6610, SC6631, PS2500 (Miwon), Genomer 03-849, 3485, 3611, 6043/M22, 6050/TM (RAHN), UV-R5002, UV-R5003 (An Fong), UN-1255, UN-6200, UN-6301 (Negami), and corresponding products to the above with similar structures.

In order to improve the properties of the ink composition after UV curing, such as flexibility, pigment wetting, adhesion, and chemical resistance, the curable composition for inkjet may be blended with a polyurethane (meth)acrylate compound. The polyurethane (meth)acrylate compound contains aliphatic or aromatic segments of different lengths, or a combination thereof, and a carbamate group with its own hydrogen bonding ability has achieved the above characteristics, and examples may include CN8000NS, CN8003NS, CN8004NS, CN8007NS, CN8009NS, CN8010NS, CN8881NS, CN9001NS, CN9006NS, CN9007, CN9010NS, CN9013NS, CN9014NS, CN9021NS, CN910A70, CN91110NS, CN9178NS, CN959 (Sartomer), DM5212, DM5220, DM541, DM553, DM554, DM570, DM5700, DM583-1, DM584, DM588, DM5900, DM7200, DM7210, DM6135, DM624, DM653 (DBC), MIRAMER PU210, PU256, PU2100, PU2510, PU2560, PU320, PU340, PU3200, PU3210, PU3450, UA5210, UA5216, SC2404, SC2565 (Miwon), Genomer 42054188/EHA, 4212, 4215, 4217, 4230, 4247, 4256, 4267, 4269/M22, 4277, 4297 (RAHN), BR-571MB, BR-704P, BR-7432 GB (Dymax), PHOTOMER 6008, 6009, 6010, 6019, 6024, 6215, 6230, 6578, 6620, 6621, 6622, 6644, 6892 (IGM), and corresponding products to the above with similar structures.

In order to improve characteristics such as heat resistance, chemical resistance, hardness, abrasion resistance of the ink composition after UV curing, the curable composition for inkjet may be blended with a phenolic (meth)acrylate compound, and specifically, examples may include EA7140 (Shin Nakamura Chemical), DM1636 (DBC), MIRAMER SC6300, SC6400 (Miwon), and corresponding products to the above with similar structures.

The above (meth)acrylate compounds and diluting monomers or resins may be used in combination of one or more, to make the ink composition have a good synergy, and balance the viscosity, surface tension, wettability, rheology, leveling, defoaming, compatibility, operability, and storage stability before UV curing, so as to balance, for example, the flexibility of the ink composition after UV curing, adhesion to the substrate, abrasion resistance, scratch resistance, contraction, metal corrosion, yellowing resistance, aging resistance.

(C) Photopolymerization Initiator

The photopolymerization initiator of the invention may include, but is not limited to, ketone compounds (containing acetophenone, benzophenone, and thioxanthone compounds), oxime compounds such as triazine compounds, benzoin compounds, metallocene compounds, triazine compounds, oxime derivatives, and acylphosphine compounds and combinations thereof. From the viewpoint of exposure sensitivity, the photo-radical initiator is preferably α-aminoalkylphenone, an acylphosphine compound, or an oxime compound. By adjusting to a suitable absorbance, good surface hardening properties and coating film properties may be obtained. Examples of the α-aminoalkylphenone-based photopolymerization initiator may include, for example: α-aminoacetophenone-based photopolymerization initiators such as 2-methyl-1-[4-(methylthio)phenyl]-2-morpholinoacetone-1,2-benzyl-2-dimethylamino-1-(4-morpholinephenyl)-butan-1-one, 2-(dimethylamino)-2-[(4-methylphenyl) methyl]-1-[4-(4-morpholinyl)phenyl]-1-butanon e, N,N-dimethylaminoacetophenone, and commercially-available products may include, for example: Irgacure 369, Irgacure379, Irgacure907, and the like made by BASF in Japan. In 100 parts by mass of the curable composition for inkjet, the blending ratio of the α-aminoalkylphenone-based photopolymerization initiator is preferably 1 part by mass to 10 parts by mass.

Examples of the acylphosphine-based photopolymerization initiator may include, for example: 2,4,6-trimethylbenzoyldiphenylphosphine oxide, bis(2,4,6-trimethylbenzoyl)-phenylphosphine oxide, bis(2,6-dimethoxybenzoyl)-2,4,4-trimethyl-pentylphosphine oxide. Commercially-available products may include, for example: IrgacureTPO, Irgacure819 made by BASF in Japan. In 100 parts by mass of the curable composition for inkjet, the blending ratio of the acylphosphine-based photopolymerization initiator is preferably 1 part by mass to 10 parts by mass.

The blending ratio of the α-aminoalkylphenone-based photopolymerization initiator is preferably higher than the blending ratio of the acylphosphine-based photopolymerization initiator, for example. Thereby, the decrease in surface curability by, for example, oxygen influence may be suppressed, and a cured film excellent in pencil hardness may be obtained.

Moreover, for light-absorbing ink compositions such as monomers, resins, colorants, and dyes with strong light absorption, additional oxime compounds such as oxime derivatives may be added, and examples thereof may include, but not limited to, O-acyl oxime-based compounds, 2-(o-benzoyl oxime)-1-[4-(phenylthio)phenyl]-1,2-octanedione, 1-(O-acetyloxime)-1-[9-ethyl-6-(2-methylbenzoyl)-9H-carbazol-3-yl]ethenone, O-ethoxycarbonyl-α-oxyamino-1-phenylpropan-1-one, and combinations thereof. Examples of the O-acyl oxime-based compounds may include, but not limited to, 1,2-octanedione, 2-dimethylamino-2-(4-methylbenzyl)-1-(4-morpholin-4-yl-phenyl)-butan-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenyl sulfanylphenyl)-octane-1-oxime-O-acetate, 1-(4-phenylsulfanylphenyl)-butan-1-oxime-O-acetate, and combinations thereof.

For the photopolymerization initiator, photoinitiators such as tertiary amines such as ethyl N,N-dimethylaminobenzoate, isoamyl N,N-dimethylaminobenzoate, amyl-4-dimethylaminobenzoate, triethylamine, triethanolamine may be further added.

The curable composition for inkjet of the invention may obtain a low-viscosity composition suitable for inkjet printing from the difunctional (meth)acrylate compound containing the alkylene chain. Moreover, by combining an α-aminoalkylphenone-based photopolymerization initiator and an acylphosphine oxide-based photopolymerization initiator, suitable absorption brightness is adjusted when the film thickness is 10 μm, and the absorbance at a wavelength 365 nm is 0.08 to 0.8, and the absorbance at a wavelength 385 nm is 0.05 to 0.3, and good surface hardening and coating properties may be obtained. When the film thickness is 10 μm, the absorption brightness at a wavelength of 365 nm is preferably 0.11 to 0.7, and the absorption brightness at a wavelength of 385 nm is preferably 0.06 to 0.3. When the film thickness is 10 μm, the absorbance at a wavelength of 365 nm is 0.08 or more, and good surface hardening may be obtained. When the absorbance at 365 nm is 0.8 or less, good inkjet printability, solder heat resistance, and gold plating resistance may be obtained. When the absorbance at a wavelength of 385 nm is 0.05 or more, good surface hardening may be obtained; when the absorbance at a wavelength of 385 nm is 0.3 or less, good inkjet printability, solder heat resistance, and gold plating resistance may be obtained.

The curable composition for inkjet of the invention may contain various components in addition to the above components. In this case, for the curable composition for inkjet of the invention, the technical means of adjusting material and blending amount so that brightness absorption may fall into the above numerical range is also important.

(D) Thermosetting Resin

A thermosetting resin may be added to the curable composition for inkjet of the invention, and adhesion or heat resistance may be improved by adding the thermosetting resin. The thermosetting resin of the invention may include a known thermosetting resin such as an amine resin such as melamine resin, benzoguanamine resin, melamine derivative, benzoguanamine derivative, capping isocyanate compound, cyclocarbonate compound, a thermosetting component having a cyclic (thio)ether group, bismaleimide, carbodiimide resin. In addition, aromatic amine having a benzene ring or a reactant of an amine compound and an epoxy compound, and the like may also be used. A capping isocyanate compound is preferable because of the excellent storage stability thereof.

The thermosetting component having the plurality of cyclic (thio)ether groups in the molecule is a compound having any one or two of the groups of a plurality of cyclic (thio)ether groups of 3, 4, or 5 membered rings in the molecule, and examples may include: compounds having a plurality of epoxy groups in the molecule, that is, polyfunctional epoxy compounds, compounds having a plurality of oxetanyl groups in the molecule, that is, polyfunctional oxetane compounds, compounds having a plurality of thioether groups in the molecule, that is, episulfide resins.

Examples of the polyfunctional epoxy compounds may include: epoxidized vegetable oil such as ADK CIZER 0-130P, ADK CIZER O-180A, ADK CIZER D-32, ADK CIZER D-55 (ADEKA); bisphenol A epoxy resins such as jER828, jER834, jER1001, jER1004 (Mitsubishi Chemical), EHPE3150 (DAICEL), EPICLON 840, EPICLON 850, EPICLON 1050, EPICLON 2055 (DIC), EPO TOHTO YD-011, YD-013, YD-127, YD-128 (TOHTO Kasei), D.E.R.317, D.E.R.331, D.E.R.661, D.E.R.664 (Dow Chemical), SUMI-EPDXY ESA-011, ESA-014, ELA-115, ELA-128 (Sumitomo Chemical), A.E.R.330, A.E.R.331, A.E.R.661, A.E.R.664 (Asahi Kasei); hydroquinone epoxy resins such as YDC-1312 (TOHTO Kasei); bisphenol epoxy resins such as YSLV-80XY (TOHTO Kasei); thioether epoxy resins such as YSLV-120TE (TOHTO Kasei); brominated epoxy resins such as jERYL903 (Mitsubishi Chemical), EPICLON 152, EPICLON 165 (DIC), EPO TOHTO YDB-400, YDB-500 (TOHTO Kasei), D.E.R.542 (Dow Chemical), SUMI-EPDXY ESB-400, ESB-700 (Sumitomo Chemical), A.E.R.711, A.E.R.714 (Asahi Kasei); novolac epoxy resins such as jER152, jER154 (Mitsubishi Chemical), D.E.N.431, D.E.N.438 (Dow Chemical), EPICLON N-730, EPICLON N-770, EPICLON N-865 (DIC), EPO TOHTO YDCN-701, YDCN-704 (TOHTO Kasei), EPPN-201, EOCN-1025, EOCN-1020, EOCN-1045, RE-306 (Nippon Kayaku), SUMI-EPDXY ESCN-195X, ESCN-220 (Sumitomo Chemical), A.E.R.ECN-235, ECN-299 (Asahi Kasei); biphenyl novolac epoxy resins such as NC-3000, NC-3100 (Nippon Kayaku); bisphenol F epoxy resins such as EPICLON 830 (DIC), jER807 (Mitsubishi Chemical), EPO TOHTO YDF-170, YDF-175, YDF-2004 (TOHTO Kasei); hydrogenated bisphenol A epoxy resins such as EPO TOHTO ST-2004, ST-2007, ST-3000 (TOHTO Kasei); jER604 (Mitsubishi Chemical), EPO TOHTO YH-434 (TOHTO Kasei); glycidylamine epoxy resins such as SUMI-EPDXY ELM-120 (Sumitomo Chemical); hydantoin epoxy resins; alicyclic epoxy resins such as CELLOXIDE 2021 (Daicel); trihydroxyphenylmethane epoxy resins such as YL-933 (Mitsubishi Chemical), T.E.N., EPPN-501, EPPN-502 (Dow Chemical); bixylenol or biphenyl epoxy resins such as YL-6056, YX-4000, YL-6121 (Mitsubishi Chemical), or a mixture thereof; bisphenol S epoxy resins such as EBPS-200 (Nippon Kayaku) and EPX-30 (ADEKA), EXA-1514 (DIC); bisphenol A novolac epoxy resins such as jER157S (Mitsubishi Chemical); tetraphenol ethane epoxy resins such as jERYL-931 (Mitsubishi Chemical); heterocyclic epoxy resins such as TEPIC (Nissan Chemical Industries, Ltd.); diglycidyl phthalate resins such as BLEMMER DGT (NOF Corporation); tetraglycidyl xylenol ethane resins such as ZX-1063 (TOHTO Kasei); naphthyl-containing epoxy resins such as ESN-190, ESN-360 (Nippon Steel Chemical & Material Co., Ltd.), HP-4032, EXA-4750, EXA-4700 (DIC); epoxy resins having a dicyclopentadiene skeleton such as HP-7200, HP-7200H (DIC); glycidyl methacrylate copolymer-based epoxy resins such as CP-505, CP-50M (NOF Corporation); copolymerized epoxy resins of cyclohexylmaleimide and glycidyl methacrylate; epoxy-modified polybutadiene rubber derivatives such as PB-360 (Daicel); CTBN-modified epoxy resins such as YR-102, YR-450 (TOHTO Kasei), but not limited thereto. These epoxy resins may be used alone or in combination of two or more, and in particular novolac epoxy resins, bixylenol epoxy resin, biphenyl epoxy resins, biphenyl novolac epoxy resins, naphthalene epoxy resins, or a mixture thereof is preferred.

Examples of the polyfunctional oxetane compound series may include, for example: bis[(3-methyl-3-oxetanyl-methoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methacrylate, (3-ethyl-3-oxetanyl)methacrylate, (3-methyl-3-oxetanyl)methyl methacrylate, (3-ethyl-3-oxetanyl)methyl methacrylate, or polyfunctional oxetanes of such oligomers or copolymers. In particular, oxetanol may form, for example, oligomer or copolymer resins containing an ether bond with compounds having a hydroxyl group such as novolac resin, poly(p-hydroxystyrene), cardo bisphenol, calixarene, resorcinol calixarene, or silsesquioxane. In addition, the copolymer of an unsaturated monomer having an oxetane ring and alkyl (meth)acrylate may also be used, for example.

Examples of the compound having the plurality of cyclic thioether groups in the molecule may include, for example: bisphenol A episulfide resin YL7000 manufactured by Mitsubishi Chemical Corporation. In addition, the following may also be used: using the same synthesis method, an episulfide resin or the like in which the oxygen atom of the epoxy group of the novolac epoxy resin is substituted with a sulfur atom.

The cyclic (thio)ether thermosetting component may be additionally added with a curing agent to increase the structural strength after thermosetting, such as an acid anhydride, phenolic resin, or amine compound.

The acid anhydride curing agent is not particularly limited, and specific examples may include, for example: phthalic anhydride, hexahydrophthalic anhydride, alkylhexahydrophthalic anhydride (such as methylhexahydrophthalic anhydride), tetrahydrophthalic anhydride, alkyl tetrahydrophthalic anhydride (such as 3-methyltetrahydrophthalic anhydride), trialkyltetrahydrophthalic anhydride, maleic anhydride, butyric anhydride, succinic anhydride, methyl nadic anhydride, trimellitic anhydride, pyromellitic anhydride, methylnorbornene-2,3-dicarboxylic acid. The above may be used alone or in combination of two or more.

The phenolic resin is not particularly limited, and is preferably novolac resin. The novolac resin is a condensation polymer of phenol, cresol, naphthol, alkylphenol, bisphenol, or terpene phenol and formaldehyde. Specific examples of the phenolic resin may include, for example: novolac resin, phenol novolac resin, cresol novolac resin, alkyl phenol novolac resin, xylenol novolac resin, butylphenol novolac resin, biphenol novolac resin, terpene phenol novolac resin, α-naphthol novolac resin, β-naphthol novolac resin, dicyclopentadiene cresol resin, poly p-vinyl phenol resin, bisphenol A novolac, xylene-modified novolac resin, decalin-modified novolac resin, poly(di-o-hydroxyphenyl)methane, poly(di-m-hydroxyphenyl)methane, and poly(di-p-hydroxyphenyl)methane. In particular, cresol novolac resin is preferable in terms of compatibility with the ink composition.

The amine compound is not particularly limited, and specific examples may include, for example: dimethyldiaminotoluene, diaminodibutyltoluene, diaminodipropyltoluene, tetramethyldiaminodiphenylmethane, tetraethyldiaminodiphenylmethane, diethyldimethyldiaminodiphenylmethane, diaminodiphenyl sulfone, diaminoxylyl sulfone, diethyldiaminotoluene, bis(4-amino-3-ethylphenyl)methane, and polytetramethylene-di-p-aminobenzoate. The above may be used alone or in combination of two or more.

The amount of the curing agent used is preferably 0.05 equivalents to 1.5 equivalents, more preferably 0.1 equivalents to 1.2 equivalents, based on 1 equivalent of the cyclic (thio)ether group. Thereby, the curability of the cyclic (thio)ether-based thermosetting composition may be improved, and the rigidity, chemical resistance, and solder resistance of the cured product may be improved.

A curing accelerator may be additionally added to the cyclic (thio)ether-based thermosetting component. The curing accelerator is not particularly limited, and specific examples may include, for example: imidazole-based curing accelerator, phosphorus-based curing accelerator, amine-based curing accelerator, organometallic compound, phosphorus-based curing accelerator, double ring and derivatives thereof, organometallic compound or organometallic complex and urea-modified polyamine. The curing accelerator is preferably a latent curing accelerator. Examples of a potential curing accelerator include imidazole-based curing accelerator, phosphorus-based curing accelerator, amine-based curing accelerator, and microcapsule curing accelerator. In the case of using a curing accelerator, the curing agent is preferably used in an amount of 0.1 parts by mass to 40 parts by mass, more preferably 1 part by mass to 30 parts by mass.

Specific examples of the imidazole curing accelerator may include, for example: imidazole, 2-methylimidazole, 2-ethylimidazole, 2-ethyl-4-methylimidazole, 1-isobutyl-2- methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-trimellitic acid-1-cyanoethyl-2-undecylimidazolium, 1-trimellitic acid-1-cyanoethyl-2-phenylimidazolium, 2,4-diamino-6-[2'methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2-methylimidazole isocyanuric acid adduct, 2,4-diamino-6-[2'-methylimidazolyl-(1')]-ethyl-s-triazine, 2-phenylimidazole isocyanuric acid adduct, 2-phenyl-4,5-dihydroxymethylimidazole, 2-phenyl-4-methyl-5-dihydroxymethylimidazole. Specific examples of the phosphorus curing accelerator may include: a trialkylphosphine compound, such as tributylphosphine; and a triarylphosphine compound, such as triphenylphosphine. Specific examples of the amine curing accelerator may include:

2,4,6-tris(dimethylaminomethyl)phenol, diethylamine, triethylamine, diethylenetetramine, triethylenetetramine, and 4,4-dimethylaminopyridine. The amine resin used as melamine derivative, benzoguanamine derivative, and the like is, for example: methylol melamine compound, hydroxymethylbenzoguanamine compound, methylol glycoluril compound, and methylol urea compound. Accordingly, an alkoxymethylated melamine compound, an alkoxymethylated benzoguanamine compound, an alkoxymethylated glycoluril compound, and an alkoxymethylated urea compound are obtained by respectively converting the methylol of the methylol melamine compound, the hydroxymethylbenzoguanamine compound, the methylol glycoluril compound, and the methylolurea compound into alkoxymethyl. There is no particular limitation on the type of this alkoxymethyl group, for example, it may be set as: methoxymethyl, ethoxymethyl, propoxymethyl, butoxymethyl, especially melamine derivatives having a formaldehyde concentration of 0.2% or less, which are harmless to the human body or the environment, are preferred.

Commercially-available products thereof may include, for example: Cymel 300, 301, 303, 370, 325, 327, 701, 266, 267, 238, 1141, 272, 202, 1156, 1158, 1123, 1170, 1174, UFR65, 300 (Mitsui Cyanamid), NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM, Mw-750LM (SANWA CHEMICAL). These thermosetting components may be used alone or in combination of two or more.

The isocyanate compound and the capping isocyanate compound are compounds having a plurality of isocyanate groups or capping isocyanate groups in one molecule. As such a compound having the plurality of isocyanate groups or capping isocyanate groups in one molecule, examples may include, for example: a polyisocyanate compound or a capping isocyanate compound. Moreover, capping isocyanate group means a functional group in which the isocyanate group is protected and temporarily inactivated by reaction with a capping agent. When heated to a specific temperature, the capping agent dissociates to generate an isocyanate group. It was confirmed that the addition of the polyisocyanate compound or capping isocyanate compound improved the curability and the toughness of the obtained cured product. As the polyisocyanate compound, for example, aromatic polyisocyanate, aliphatic polyisocyanate, or alicyclic polyisocyanate may be used.

Specific examples of the aromatic polyisocyanate may include: 4,4'-diphenylmethane diisocyanate, 2,4-tolylene diisocyanate, 2,6-methylene diisocyanate, naphthalene-1,5-diisocyanate, o-xylylene diisocyanate, m-xylylene diisocyanate, and 2,4-tolylene dimer. Specific examples of the aliphatic polyisocyanate may include: tetramethylene diisocyanate, hexamethylene diisocyanate, methylene diisocyanate, trimethylhexamethylene diisocyanate, 4,4-methylenebis(cyclohexylisocyanate), and isophorone diisocyanate. Specific examples of the alicyclic polyisocyanate may include cycloheptane triisocyanate. In addition, examples of adducts, titrants, and isocyanurate compounds of the isocyanate compounds listed above may also be included.

As the capping isocyanate compound, an addition reaction product of an isocyanate compound and an isocyanate capping agent may be used. As the isocyanate compound that may react with a capping agent, examples may include the above polyisocyanate compound and the like.

Examples of the isocyanate capping agent may include, for example: phenol capping agents such as phenol, cresol, xylenol, chlorophenol, and ethyl phenol; lactam capping agents such as ε-caprolactam, δ-valerolactam, γ-butyrolactam, and β-propiolactam; active methylene capping agents such as ethyl acetoacetate and acetylacetone; alcohol capping agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; oxime capping agents such as formaldoxime, acetaldoxime, acetone oxime, methyl ethyl ketoxime, diacetyl monoxime, cyclohexane oxime; thiol capping agents such as butanethiol, hexanethiol, t-butanethiol, thiophenol, methylthiophenol, ethylthiophenol; amide capping agents such as acetamide, benzamide; imide capping agents such as succinimide and maleimide; amine capping agents such as xylidine, aniline, butylamine, dibutylamine; imidazole capping agents such as imidazole, 2-ethylimidazole; imine capping agents such as methyleneimine and acrylimine.

The capping isocyanate compound may also be a commercially-available product, and examples may include: Sumidur BL-3175, BL-4165, BL-1100, BL-1265, Desmodur TPLS-2957, TPLS-2062, TPLS-2078, TPLS-2117, Desmotherm 2170, Desmotherm 2265 (Sumitomo Bayer Urethane), CORONATE 2512, CORONATE 2513, CORONATE 2520 (Nippon Polyurethane Industries), B-830, B-815, B-846, B-870, B-874, B-882 (MITSUI TAKEDA CHEMICALS), TPA-B80E, 17B-60PX, E402-B80T (Asahi Kasei Chemicals). In addition, Sumidur BL-3175 and BL-4265 are obtained by using methyl ethyl oxime as the capping agent. Such a compound having a plurality of isocyanate groups or capping isocyanate groups in one molecule may be used alone or in combination of two or more.

In 100 parts by mass of the curable composition for inkjet, the blending amount of the thermosetting resin is preferably 1 part by mass to 30 parts by mass. When the blending amount is 1 part by mass or more, sufficient coating film toughness and heat resistance may be obtained. Moreover, in the case of 30 parts by mass or less, the decrease in storage stability may be suppressed.

In addition, by adding a colorant and a wetting and dispersing agent in the curable composition for inkjet, color and dispersibility may be adjusted, and the surface tension of the ink may be adjusted to make the ink have better levelling properties.

Colorant

The curable composition for inkjet of the invention may contain conventional colorants such as phthalocyanine·blue, phthalocyanine·green, iodine·green, disazo yellow, crystal violet, titanium oxide, carbon black, and naphthalene black. The colorant may be used alone or in combination of two or more. The blending amount of the colorant is 0.1 parts by mass to 30 parts by mass, preferably 0.5 parts by mass to 20 parts by mass, with respect to 100 parts by mass of the non-volatile component of the curable composition for inkjet. When the blending amount of the colorant is less than 0.1 part by mass, visibility is poor; and when exceeding 30 parts by mass, the photocurability of the lower part of the coating film is lowered. Since the type of the colorant and the blending amount have an influence on the absorbance of the curable composition for inkjet, they are adjusted for the object of achieving the above suitable range of absorbance.

In the case of including a white pigment as a colorant, conventional white pigments such as titanium oxide, zinc oxide, magnesium oxide, zirconium oxide, aluminum oxide, barium sulfate, silica, talc, mica, aluminum hydroxide, calcium silicate, aluminum silicate, hollow resin particles, zinc sulfide may be used. In particular, titanium oxide is preferred in terms of high colorability and reflectance. The white pigment may be used alone or in combination of two or more. Although the titanium oxide may be rutile titanium oxide or anatase titanium oxide, it is preferable to use rutile titanium in terms of colorability, concealment, and stability. Compared with rutile titanium oxide, anatase titanium oxide, which is also titanium oxide, has higher whiteness and is often used as a white pigment. However, anatase titanium oxide has photocatalytic activity. Therefore, the resin in the insulating resin composition is particularly discolored by light irradiated from an LED. On the other hand, although the whiteness of rutile titanium oxide is slightly inferior, it has almost no photoactivity. Therefore, resin deterioration (yellowing) due to light due to the photoactivity of titanium oxide is remarkably suppressed, and thermal stability is also higher. Therefore, when used as a white pigment in an insulating layer of a printed circuit board on which LEDs are mounted, a high reflectance may be maintained for a long period of time.

A known rutile titanium oxide may be used. The manufacturing method of rutile titanium oxide includes both the sulfuric acid method and the chlorine method, and those manufactured by any of the manufacturing methods may be used in the invention. Here, the sulfuric acid method refers to a manufacturing method using ilmenite ore or titanium slag as raw material, dissolving it in concentrated sulfuric acid, separating the iron component as iron sulfate, and hydrolyzing the solution, to obtain a precipitate of hydroxide, which is fired at high temperature to remove rutile titanium oxide. Moreover, the chlorine method refers to a method of synthesizing titanium tetrachloride by using synthetic rutile or natural rutile as a raw material, reacting with chlorine gas and carbon at a high temperature of about 1000° C., and oxidizing it to extract rutile titanium oxide. In particular, the rutile titanium oxide manufactured by the chlorine method has a particularly remarkable effect of suppressing resin deterioration (yellowing) due to heat, and is more suitable for use in the invention.

Commercially-available products of rutile titanium oxide may include, for example: TIPAQUE R-820, TIPAQUE R-830, TIPAQUE R-930, TIPAQUE R-550, TIPAQUE R-630, TIPAQUE R-680, TIPAQUE R-670, TIPAQUE R-780, TIPAQUE R-850, TIPAQUE CR-50, TIPAQUE CR-57, TIPAQUE CR-Super70, TIPAQUE CR-80, TIPAQUE CR-90, TIPAQUE CR-93, TIPAQUE CR-95, TIPAQUE CR-97, TIPAQUE CR-60, TIPAQUE CR-63, TIPAQUE CR-67, TIPAQUE CR-58, TIPAQUE CR-85, TIPAQUE UT771 (Ishihara Sangyo Kaisha, Ltd.), Ti-Pure R-100, Ti-Pure R-101, Ti-Pure R-102, Ti-Pure R-103, Ti-Pure R-104, Ti-Pure R-105, Ti-Pure R-108, Ti-Pure R-900, Ti-Pure R-902, Ti-Pure R-960, Ti-Pure R-706, Ti-Pure R-931(Dupont), R-25, R-21, R-32, R-7E, R-5N, R-61N, R-62N, R-42, R-45M, R-44, R-49S, GTR-100, GTR-300, D-918, TCR-29, TCR-52, FTR-700 (Sakai Chemical Industry Co., Ltd.)

In particular, TIPAQUE CR-50, TIPAQUE CR-57, TIPAQUE CR-80, TIPAQUE CR-90, TIPAQUE CR-93, TIPAQUE CR-95, TIPAQUE CR-97, TIPAQUE CR-60, TIPAQUE CR-63, TIPAQUE CR-67, TIPAQUE CR-58, TIPAQUE CR-85, TIPAQUE UT771 (Ishihara Sangyo Kaisha, Ltd.), Ti-Pure R-100, Ti-Pure R-101, Ti-Pure R-102, Ti-Pure R-103, Ti-Pure R-104, Ti-Pure R-105, Ti-Pure R-108, Ti-Pure R-900, Ti-Pure R-902, Ti-Pure R-960, Ti-Pure R-706, Ti-Pure R-931 (Dupont) manufactured by the chlorine method are more suitable for use.

Commercially-available products of the anatase titanium oxide may include, for example: TITON A-110, TITON TCA-123E, TITON A-190, TITON A-197, TITON SA-1, TITON SA-1L (Sakai Chemical Industry), TA-100, TA-200, TA-300, TA-400, TA-500, TP-2 (Fuji Titanium Industries), TITANIX JA-1, TITANIX JA-3, TITANIX JA-4, TITANIX JA-5, TITANIX JA-C (TAYCA), KA-10, KA-15, KA-20, KA-30 (Titan Industries), TIPAQUE A-100, TIPAQUE A-220, TIPAQUE W-10 (Ishihara Sangyo Kaisha, Ltd.)

The blending amount of the white pigment has great influence on light absorption, and in 100 parts by mass of the curable composition for inkjet, the blending amount of the white pigment is preferably 3 parts by mass to 50 parts by mass, more preferably 5 parts by mass to 30 parts by mass, particularly preferably 5 parts by mass to 25 parts by mass. When the blending amount of the white pigment is 3 parts by mass or more, the reflectance of the composition is sufficient. When the blending amount of the white pigment is 50 parts by mass or less, excessive increase in the viscosity of the composition and decrease in printability may be suppressed.

In the case of including a black pigment as a colorant, carbon, nigrosine, iron oxide, etc. may be used. The blending amount of the black pigment has great influence on light absorption, and in 100 parts by mass of the curable composition for inkjet, the blending amount of the black pigment is preferably 3 parts by mass to 50 parts by mass, more preferably 5 parts by mass to 30 parts by mass, and particularly preferably 5 parts by mass to 25 parts by mass.

In addition, the colorant may also include conventional pigments, such as: soluble azo pigments, insoluble azo pigments, condensed azo pigments, metal phthalocyanine pigments, metal-free phthalocyanine pigments, isoindolinone pigments, isoindoline pigments, dioxazine pigments, thioindigo pigments, anthraquinone pigments, quinophthalone pigments, metal complex pigments, diketopyrrolopyrrole pigments, and other various pigments.

Wetting and Dispersing Agent

The curable composition for inkjet of the invention may include a wetting and dispersing agent. The wetting and dispersing agent may generally include those with the dispersing effect of auxiliary pigments, such as: compounds having polar groups or polymer compounds such as carboxyl, hydroxyl, ester, such as an acid-containing compound such as phosphate ester, or copolymers containing acid groups, hydroxyl-containing polycarboxylate, polysiloxane, salt of long chain polyaminoamide and acid ester, and the like. In addition, among these wetting and dispersing agents, those having an acid value are more effective for dispersing inorganic pigments such as titanium oxide.

Specific examples of the wetting and dispersing agent may include, for example: SOLSPERSE32000, 39000, 71000, J-100, J-180, J-200, X300 (Lubrizol), Anti-Terra-U, Anti-Terra-U100, Anti-Terra-204, Anti-Terra-205, Disperbyk-101, Disperbyk-102, Disperbyk-106, Disperbyk-110, Disperbyk-111, Disperbyk-130, Disperbyk-140, Disperbyk-142, Disperbyk-145, Disperbyk-170, Disperbyk-171, Disperbyk-174, Disperbyk-180, Disperbyk-2001, Disperbyk-2025, Disperbyk-2070, Disperbyk-2096, Disperbyk-310, BYK-P104, BYK-P104S, BYK-P105, BYK-9076, BYK-220S (BYKChemie), EFKA®4300, 4330, 4340, 4400, PX 4701, 4585, 5207, 6230, 7701, 7731 (BASF). The acid value of the wetting and dispersing agent is preferably 10 mgKOH/g to 300 mgKOH/g.

The blending amount of the wetting dispersant is preferably 5 parts by mass to 75 parts by mass with respect to 100 parts by mass of the colorant.

The curable composition for inkjet of the invention may include a surface tension modifier. The blending amount of the surface tension modifier is preferably 0.01 parts by mass to 5 parts by mass with respect to 100 parts by mass of the curable composition for inkjet.

In addition to the above components, the curable composition for inkjet of the invention may also be blended with conventional additives as needed, such as surfactant and matting agents, at least one of antifoaming agents and leveling agents such as polyester-based resins, polyurethane-based resins, vinyl-based resins, acrylic-based resins, rubber-based resins, wax, silicone, fluorine, polymer-based for adjusting film properties, viscosity modifiers, electrostatic agents, polymerization inhibitors, corner coverage modifiers, light stabilizers, heat stabilizers, UV absorbers, antioxidants, stress reducing agents, ion trapping agents, silane coupling agents, adhesion promoters.

Furthermore, other than the above components, the curable composition for inkjet of this invention may also contain a resin in a range that does not impair characteristics. Although a conventional resin may be used, a (meth)acrylate compound having a polyene skeleton is preferred. The polyene skeleton is preferably formed by, for example, polybutadiene or isoprene, or by polymerization using both. The olefinic double bond derived from such a repeating unit may impart flexibility to the curable composition for inkjet for a printed circuit board, increase followability to a substrate, and obtain good adhesion. As a specific example, the following materials are preferably used. That is, liquid polybutadiene urethane (meth)acrylate obtained by the urethane addition reaction of 2-hydroxyethyl (meth)acrylate with the hydroxyl group of liquid polybutadiene via 2,4-tolylylene diisocyanate, liquid polybutadiene acrylate obtained by esterification of maleic anhydride-added maleated polybutadiene and 2-hydroxy acrylate, liquid polybutadiene (meth)acrylate obtained by epoxy esterification of the carboxyl group of maleated polybutadiene with glycidyl (meth)acrylate, liquid polybutadiene (meth)acrylate obtained by esterification reaction of epoxidized polybutadiene and (meth)acrylic acid obtained by reacting liquid polybutadiene and epoxidizing agent, liquid polybutadiene (meth)acrylate obtained by dechlorination of liquid polybutadiene having a hydroxyl group and (meth)acrylic acid chloride, liquid hydrogenated 1,2 polybutadiene (meth)acrylate formed by urethane (meth)acrylate modification of liquid hydrogenated 1,2 polybutadiene diol obtained by hydrogenating unsaturated double bonds of liquid polybutadiene having hydroxyl groups at both ends of the molecule.

Commercially-available products may include, for example: NISSO PB TE-2000, NISSOPB TEA-1000, NISSO PB TE-3000, NISSOPB TEAI-1000 (=Nippon Soda=), CN301, CN303, CN307 (SARTOMER=), BAC-15 (Osaka Organic Chemical=), BAC-45 (Osaka Organic Chemical=), EY RESIN BR-45UAS (chemical light=). The curable composition for inkjet having each of the above components is suitable for the inkjet method. Therefore, the viscosity of the curable composition for inkjet at a temperature of 50° C. is 50 mPa·s or less, preferably 5 mPa·s to 50 mPa·s, more preferably 5 mPa·s to 20 mPa·s. Accordingly, unnecessary load on the inkjet printer may be avoided, and printing may be performed smoothly. The viscosity of the curable composition for inkjet refers to the viscosity measured at normal temperature (25° C.) or 50° C. in accordance with JIS K2283. As long as it is 150 mPa·s or less at room temperature, or the viscosity at 50° C. is 5 mPa·s to 50 mPa·s, the inkjet printing method may print smoothly.

Moreover, the maximum particle diameter of the particles contained in the curable composition for inkjet is preferably 0.1 μm to 5 μm, more preferably 0.1 μm to 1 μm. If the maximum particle size is 0.1 μm or more, the cohesion of the particles is not too high. When the maximum particle size is 5 μm or less, the possibility of issues such as nozzle clogging during inkjet printing is reduced. The maximum particle diameter of the particles contained in the curable composition for inkjet may be measured by a particle size distribution meter, and the D100 value thereof is used as the maximum particle diameter.

The curable composition for inkjet of the invention may be used as an ink for an inkjet system via the above composition, and for example, a flexible circuit board may also be printed by a roll-to-roll system. In this case, after applying to a substrate via an inkjet method, irradiation may be performed with a light irradiation light source to form a cured coating film used as a cured product. The light irradiation is performed by irradiation with ultraviolet rays or active energy rays, but ultraviolet rays are preferred. The light source for light irradiation is preferably, for example, a low-pressure mercury lamp, a medium-pressure mercury lamp, a high-pressure mercury lamp, an ultra-high pressure mercury lamp, a xenon lamp, a metal halide lamp, an LED lamp, and the like. Others including, for example, electron beams, alpha rays, beta rays, gamma rays, X rays, neutron radiation may also be used.

Furthermore, curing is performed by heating after light irradiation as needed. Here, the heating temperature is, for example, 70° C. to 200° C. Curing may be performed sufficiently by setting to the heating temperature range. The heating time is, for example, 10 minutes to 100 minutes.

Cured Product

The curable composition for inkjet of the invention may form a patterned cured product. The patterned cured product is excellent in adhesion to a printed circuit board including a plastic substrate mainly composed of polyimide and the like and a conductor circuit provided thereon, and has excellent properties such as solder heat resistance, chemical resistance, solvent resistance, pencil hardness, electroless gold plating resistance, and bendability.

Printed Circuit Board

In the printed circuit board of the invention, the cured product consisting of the curable composition for inkjet is provided on the base material having a circuit pattern. The printed circuit board of the invention may be manufactured by the following method.

First, the curable composition for inkjet is applied on a substrate after a circuit is formed by an inkjet method to form a cured product having a pattern. Here, when the curable composition for inkjet contains a photobase generator, it is preferable to heat the cured product, for example, after light irradiation for curing, and the heating temperature is 70° C. to 200° C., for example.

Although the curable composition for inkjet of the invention is suitable as a material for forming a cured product of a printed circuit board, it is particularly suitable as a material for forming a permanent film of a printed circuit board, wherein it is suitable as a material for forming a permanent insulating film such as a solder resist. Moreover, the curable composition for inkjet of the invention may also be used as a symbol marking material formed on a substrate or a hard film, a material for forming a cover, or a material for forming an interlayer insulating layer.

Hereinafter, the curable composition for inkjet proposed by the invention will be described in detail with reference to experimental examples. However, the following experimental examples are not intended to limit the invention.

EXAMPLES

Synthesis Example 1

The reactor equipment was a 500 mL reaction flask, with nitrogen injection and stirring device. 46 mmol 2,2-bis[4-(4-aminophenoxy)-phenyl)]propane (BAPP) and 50 mmol 2,2-bis(3,4-dicarboxyphenyl)hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 2

The reactor equipment was the same as that of Synthesis example 1, 48 mmol 2,2-bis[4-(4-aminophenoxy)-phenyl)] propane (BAPP) and 50 mmol 2,2-bis(3,4-dicarboxyphenyl) hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 3

The reactor equipment was the same as that of Synthesis example 1, 49 mmol 2,2-bis[4-(4-aminophenoxy)-phenyl)] propane (BAPP) and 50 mmol 2,2-bis(3,4-dicarboxyphenyl) hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 4

The reactor equipment was the same as that of Synthesis example 1, 48 mmol bis(trifluoromethyl)benzidine (TFMB) and 50 mmol (isopropyldiphenoxy)bis(phthalic anhydride) (BPADA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 5

The reactor equipment was the same as that of Synthesis example 1, 48 mmol 2,2'-bis(trifluoromethyl)-4,4'-diaminophenyl ether (6FODA) and 50 mmol (isopropyldiphenoxy) bis(phthalic anhydride) (BPADA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 6

The reactor equipment was the same as that of Synthesis example 1, 48 mmol bis(trifluoromethyl)benzidine (TFMB) and 50 mmol 2,2-bis[4-(3,4-dicarboxyphenoxy)phenyl] hexafluoroisopropane dianhydride (HFBPADA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 7

The reactor equipment was the same as that of Synthesis example 1, 48 mmol bisaminophenoxybenzene hexafluoropropane (6FBAPP) and 50 mmol 2,2-bis(3,4-dicarboxyphenyl)hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 8

The reactor equipment was the same as that of Synthesis example 1, 48 mmol 4,4'-bis(3-aminophenoxy)diphenylsulfone (BAPS) and 50 mmol 2,2-bis(3,4-dicarboxyphenyl)hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 9

The reactor equipment was the same as that of Synthesis example 1, 48 mmol bis(trifluoromethyl)benzidine (TFMB), and 25 mmol (isopropyldiphenoxy)bis(phthalic anhydride) (BPADA) and 25 mmol 1,2,4,5-cyclohexanetetracarboxylic dianhydride (HPMDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 10

The reactor equipment was the same as that of Synthesis example 1, 48 mmol diaminodiphenyl ether (ODA), and 25 mmol (isopropyldiphenoxy)bis(phthalic anhydride) (BPADA) and 25 mmol 2,2-bis(3,4-dicarboxyphenyl)hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Example 11

The reactor equipment was the same as that of Synthesis example 1, 24 mmol diaminodiphenyl ether (ODA) and 24 mmol bis(trifluoromethyl)benzidine (TFMB), and 25 mmol (isopropyldiphenoxy)bis(phthalic anhydride) (BPADA) and 25 mmol 4,4'-oxydiphthalic anhydride (ODPA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Comparative Example 1

The reactor equipment was the same as that of Synthesis example 1, 48 mmol diaminodiphenyl ether (ODA) and 50 mmol (isopropyldiphenoxy)bis(phthalic anhydride) (BPADA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Comparative Example 2

The reactor equipment was the same as that of Synthesis example 1, 50 mmol 2,2-bis[4-(4-aminophenoxy)-phenyl)]propane (BAPP) and 50 mmol 2,2-bis(3,4-dicarboxyphenyl)hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Comparative Example 3

The reactor equipment was the same as that of Synthesis example 1, 48 mmol 2,2-bis[4-(4-aminophenoxy)-phenyl)]propane (BAPP) and 50 mmol Bicyclo[2.2.2]oct-7-ene-2,3,5,6-tetracarboxylic dianhydride (B1317) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Comparative Example 4

The reactor equipment was the same as that of Synthesis example 1, 48 mmol bis(trifluoromethyl)benzidine (TFMB) and 50 mmol bicyclo[2.2.2]oct-7-ene-2,3,5,6-tetracarboxylic dianhydride (B1317) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Synthesis Comparative Example 5

The reactor equipment was the same as that of Synthesis example 1, 48 mmol diaminodiphenyl ether (ODA) and 50 mmol 2,2-bis(3,4-dicarboxyphenyl)hexafluoropropane dianhydride (6FDA) were dissolved in N-methylpyrrolidone (NMP) and 5 mmol triethylamine solution at room temperature in a nitrogen environment, and the solid content here was 20 wt %. The reaction temperature was 190° C., and after 4 hours of polymerization, after the colloid was cooled, polyimide powder was precipitated with a methanol and water mixture (ratio of 2:1), and dried in an oven at 80° C.

Table 1 shows the composition and related properties of the polyimides of the Synthesis examples and Synthesis comparative examples.

TABLE 1

| | Dianhydride | Diamine | Molar ratio of dianhydride to diamine | Intrinsic viscosity | Solubility | | | |
|---|---|---|---|---|---|---|---|---|
| | | | | | DMAc | NMP | GBL | HDDA |
| Synthesis example 1 | 6FDA | BAPP | 1:0.92 | 0.31 | ○ | ○ | ○ | ○ |
| Synthesis example 2 | 6FDA | BAPP | 1:0.96 | 0.56 | ○ | ○ | ○ | ○ |

TABLE 1-continued

| | Dianhydride | Diamine | Molar ratio of dianhydride to diamine | Intrinsic viscosity | Solubility | | | |
|---|---|---|---|---|---|---|---|---|
| | | | | | DMAc | NMP | GBL | HDDA |
| Synthesis example 3 | 6FDA | BAPP | 1:0.98 | 0.72 | ○ | ○ | ○ | ○ |
| Synthesis example 4 | BPADA | TFMB | 1:0.96 | 0.51 | ○ | ○ | ○ | ○ |
| Synthesis example 5 | BPADA | 6FODA | 1:0.96 | 0.55 | ○ | ○ | ○ | ○ |
| Synthesis example 6 | 6FBPADA | TFMB | 1:0.96 | 0.51 | ○ | ○ | ○ | ○ |
| Synthesis example 7 | 6FDA | 6FBAPP | 1:0.96 | 0.57 | ○ | ○ | ○ | ○ |
| Synthesis example 8 | 6FDA | BAPS | 1:0.96 | 0.56 | ○ | ○ | ○ | ○ |
| Synthesis example 9 | BPADA + HPMDA (1:1) | TFMB | 1:0.96 | 0.52 | ○ | ○ | ○ | ○ |
| Synthesis example 10 | BPADA + 6FDA (1:1) | ODA | 1:0.96 | 0.59 | ○ | ○ | ○ | ○ |
| Synthesis example 11 | BPADA + ODPA (1:1) | TFMB + ODA (1:1) | 1:0.96 | 0.58 | ○ | ○ | ○ | ○ |
| Synthesis comparative example 1 | BPADA | ODA | 1:0.96 | 0.56 | ○ | ○ | ○ | X |
| Synthesis comparative example 2 | 6FDA | BAPP | 1:1 | 0.98 | ○ | ○ | ○ | X |
| Synthesis comparative example 3 | B1317 | BAPP | 1:0.96 | 0.53 | ○ | ○ | ○ | X |
| Synthesis comparative example 4 | B1317 | TFMB | 1:0.96 | 0.52 | ○ | ○ | ○ | X |
| Synthesis comparative example 5 | 6FDA | ODA | 1:0.96 | 0.59 | ○ | ○ | ○ | X |

Intrinsic Viscosity Measurement Method

Using Ubbelohde No. 100 viscometer, dimethylacetamide (DMAc) (blank experiment) was first put into the Ubbelohde viscometer, and then put into a thermostatic water bath at 30° C., and the time (to) for the solution to flow through the two marked lines on the viscometer was calculated by a timer. Then, using dimethylacetamide (DMAc) as solvent, the polyamic acid solution was prepared to a concentration of 0.5 g/dL, the time (t) for the solution to flow through the two marked lines on the viscometer was measured in the same way, and the measured time was brought into the following equation to calculate the intrinsic viscosity ηinh.

$\eta inh = \ln(t/to)/C$ to: time (sec) needed for pure solvent to pass through capillary
t: time (sec) needed for solution to pass through capillary,
C: concentration of solution (g/dL)

Solubility Measurement Method

The powders produced in Synthesis example 1 to Synthesis example 11 and Synthesis comparative example 1 to Synthesis comparative example 5 were respectively dissolved in dimethylacetamide (DMAc), N-methylpyrrolidone (NMP), and γ-butyrolactone (γ-GBL) solvent and a difunctional (meth)acrylate compound (HDDA) of an alkylene chain and stirred for 24 hours at a prepared solution concentration of 20 wt % and a temperature of 60 degrees to confirm whether the powders could be completely dissolved.

Monomers used in Synthesis example 1 to Synthesis example 11 and Synthesis comparative example 1 to Synthesis comparative example 5 were all monomers used in conventional dimethylacetamide (DMAc), N-methylpyrrolidone (NMP), and γ-butyrolactone (γ-GBL) solvent-soluble polyimide resins. However, the results of the Synthesis examples and the Synthesis comparative examples show that the polyimide not soluble in the solvent was also soluble in the difunctional (meth)acrylate compound of the alkylene chain. From the results, it is shown that only the combination of the structural formula 1 and the fluorine-containing monomer may be dissolved in the difunctional (meth)acrylate compound of the alkylene chain. Moreover, from the results of Synthesis example 1 to Synthesis example 3 and Synthesis example 2, under the same monomer, when the intrinsic viscosity was greater than 0.8, the molecular weight was too large to be dissolved in the difunctional (meth) acrylate compound of the alkylene chain.

The HDDA-soluble polyimides from Synthesis example 1 to Synthesis example 3 were blended with the components shown in Table 2 in the proportions (unit: parts) shown in the same table, and preliminarily mixed with a mixer to prepare curable compositions for inkjet. Table 2 shows the composition of the inkjet curable compositions, and Table 3 shows the characteristics of the cured films.

TABLE 2

| | PI Polyimide resin | Photocuring agent | | | Photo-initiator | | Thermal hardener | | Color-ant | Additive | | Weight ratio of polyimide to difunctional acrylate compound containing |
|---|---|---|---|---|---|---|---|---|---|---|---|---|
| | | IBOA | HDDA | EA-1010N | ITX | I-819 | MY721 | MeHHPA | G36 | AMM-0B4 | KBM-403 | alkylene chain or alkoxy chain |
| Example 1 | Synthesis example 1 8% | 10% | 42% | 5% | 0.5% | 4% | 5% | 5% | 14.5% | 0.5% | 0.5% | 19% |
| Example 2 | Synthesis example 1 15% | 10% | 40% | 5% | 0.5% | 4% | 5% | 5% | 14.5% | 0.5% | 0.5% | 37.5% |
| Example 3 | Synthesis example 2 8% | 10% | 42% | 5% | 0.5% | 4% | 5% | 5% | 14.5% | 0.5% | 0.5% | 19% |
| Example 4 | Synthesis example 3 8% | 10% | 42% | 5% | 0.5% | 4% | 5% | 5% | 14.5% | 0.5% | 0.5% | 19% |
| Example 5 | Synthesis example 4 8% | 10% | 42% | 5% | 0.5% | 4% | 5% | 5% | 14.5% | 0.5% | 0.5% | 19% |
| Example 6 | Synthesis example 5 8% | 10% | 42% | 5% | 0.5% | 4% | 5% | 5% | 14.5% | 0.5% | 0.5% | 19% |
| Example 7 | Synthesis example 6 8% | 10% | 42% | 5% | 0.5% | 4% | 5% | 5% | 14.5% | 0.5% | 0.5% | 19% |
| Example 8 | Synthesis example 7 8% | 10% | 42% | 5% | 0.5% | 4% | 5% | 5% | 14.5% | 0.5% | 0.5% | 19% |
| Example 9 | Synthesis example 8 8% | 10% | 42% | 5% | 0.5% | 4% | 5% | 5% | 14.5% | 0.5% | 0.5% | 19% |
| Example 10 | Synthesis example 9 8% | 10% | 42% | 5% | 0.5% | 4% | 5% | 5% | 14.5% | 0.5% | 0.5% | 19% |
| Example 11 | Synthesis example 10 8% | 10% | 42% | 5% | 0.5% | 4% | 5% | 5% | 14.5% | 0.5% | 0.5% | 19% |
| Example 12 | Synthesis example 11 8% | 10% | 42% | 5% | 0.5% | 4% | 5% | 5% | 14.5% | 0.5% | 0.5% | 19% |
| Comparative example 1 | 0% | 10% | 55% | 5% | 0.5% | 4% | 5% | 5% | 14.5% | 0.5% | 0.5% | 0% |
| Comparative example 2 | Synthesis example 1 0.3% | 10% | 49.7% | 5% | 0.5% | 4% | 5% | 5% | 14.5% | 0.5% | 0.5% | 0.6% |
| Comparative example 3 | Synthesis example 1 20% | 5% | 35% | 5% | 0.5% | 4% | 5% | 5% | 14.5% | 0.5% | 0.5% | 57% |
| Comparative example 4 | Synthesis example 9 20% | 10% | 35% | 5% | 0.5% | 4% | 5% | 5% | 14.5% | 0.5% | 0.5% | 57% |

IBOA: monofunctional acrylate compound of cycloaliphatic chain
HDDA: difunctional acrylate compound having alkylene chain
EA-1010N: bisphenol epoxy acrylate compound
ITX: α-aminoalkylphenone-based photopolymerization initiator
I-819: acylphosphine oxide-based photopolymerization initiator
MY721 + Me-HHPA: thermosetting components
G36: colorant
AMM-0B4, KBM-403: other additives

TABLE 3

| | Viscisoty@ 45 degrees (cps) | Fluency | Thickness (μm) | Copper foil flexible board outward fold r = 3 mm | Adhesion@ roughened copper | Solder resist heat resistance | Withstand voltage test (thickness = 15) |
|---|---|---|---|---|---|---|---|
| Example 1 | 12.5 | ○ | 30 | ○ | 5B | ○ | 2.8 |
| Example 2 | 18.3 | ○ | 30 | ○ | 4B | ○ | 3.5 |
| Example 3 | 14.1 | ○ | 30 | ○ | 5B | ○ | 2.6 |
| Example 4 | 15.3 | ○ | 30 | ○ | 4B | ○ | 2.7 |
| Example 5 | 13.9 | ○ | 30 | ○ | 5B | ○ | 2.5 |
| Example 6 | 14.2 | ○ | 30 | ○ | 4B | ○ | 2.6 |
| Example 7 | 13.5 | ○ | 30 | ○ | 5B | ○ | 2.6 |
| Example 8 | 14.2 | ○ | 30 | ○ | 5B | ○ | 2.5 |
| Example 9 | 14.5 | ○ | 30 | ○ | 5B | ○ | 2.3 |
| Example 10 | 13.9 | ○ | 30 | ○ | 5B | ○ | 2.4 |
| Example 11 | 14.7 | ○ | 30 | ○ | 5B | ○ | 2.7 |
| Example 12 | 15.1 | ○ | 30 | ○ | 5B | ○ | 2.5 |
| Comparative example 1 | 10.3 | ○ | 30 | X | 4B | ○ | 2.0 |
| Comparative example 2 | 12.8 | ○ | 30 | X | 5B | ○ | 2.2 |
| Comparative example 3 | 20.5 | Δ | 30 | ○ | 2B | ○ | 3.4 |

TABLE 3-continued

| | Viscisoty@ 45 degrees (cps) | Fluency | Thickness (μm) | Copper foil flexible board outward fold r = 3 mm | Adhesion@ roughened copper | Solder resist heat resistance | Withstand voltage test (thickness = 15) |
|---|---|---|---|---|---|---|---|
| Comparative example 4 | 40 | X | 30 | ○ | 1B | ○ | 3.6 |

Viscosity Test Method

The viscosities in Table 3 are the viscosities of the inkjet curable compositions measured by a cone-plate viscometer (Brookfield DV-2T) at 45° C. and 100 rpm.

Fluency Evaluation

In Table 3, IJ printability was confirmed by the state of ejection by the inkjet head during inkjet printing, and was evaluated according to the following criteria.
  ○: good ejection
  Δ: could eject but not well
  ×: could not eject Drawing Conditions with Inkjet Printer
  Film thickness: 20 μm
  Device: piezoelectric inkjet printer (using KC-100 12PASS×600 dpi (DIP) (print head temperature 45° C.))
  Amount of exposure: 1000 mJ/cm$^2$
  Wavelength: 395 nm (10 W)

Copper Adhesion Evaluation Method

Adhesion was applying the curable compositions to a copper foil with a thickness of 30 μm by an inkjet coating device, and using a high-pressure mercury lamp, and curing with an exposure amount of 1000 mJ/cm$^2$. Then, heat treatment was performed for 60 minutes in a hot air circulating drying furnace at 150° C. For the samples obtained in this manner, a 100-grid tape peel test was performed.

Solder Heat Resistance Evaluation Method

Using the same samples as those obtained in the above adhesion test, the cured coating films were immersed in a solder bath at 288° C. for 10 seconds according to the method of JIS C 5012 3 times. The state of the coating films after performing a peeling test by a cellophane adhesive tape was visually observed, and evaluated according to the following criteria.

Evaluation Criteria
  ○: no peeling or swelling in the coating film
  ×: peeling or swelling in the coating film Bending Resistance Test The cured coating films were bent at a bending angle R=3 mm using the same samples obtained in the above adhesion test, and the cured coating films were at the outermost layer of bending curvature during bending, and evaluated according to the following criteria.

Evaluation Criteria
  ○: within 10,000 times, the coating was not cracked and broken.
  Δ: 5001 to 10000 times, the coating was cracked or broken.
  ×: within 5000 times, the coating was cracked or broken.

Withstand Voltage Test

The measurement was performed in accordance with IPC-TM-650 2.5.7 using the same samples obtained in the above adhesion test.

As shown in Table 3, when the soluble polyimide was added to the difunctional (meth)acrylate compound containing the alkylene chain or the alkoxy chain in less than 1 wt % in the cured coating, the bendability of the cured coating was not improved, and cracks occurred after bending with a radius of R=3 mm. When the soluble polyimide was added to the difunctional (meth)acrylate compound containing the alkylene chain or the alkoxy chain in more than 40 wt % in the cured coating, the adhesion between the ink and the substrate was affected. In addition, if the intrinsic viscosity of the soluble polyimide used was higher, the ink jetting condition was also affected.

Based on the above, the curable composition for inkjet of the invention includes a soluble polyimide resin, a photocurable acrylate compound, a photopolymerization initiator, and a thermosetting resin. The photocurable acrylate compound includes a difunctional (meth)acrylate compound containing an alkylene chain or an alkoxy chain. The soluble polyimide resin is dissolved in the difunctional (meth)acrylate compound containing an alkylene chain or an alkoxy chain. Therefore, the curable composition for inkjet of the invention is excellent in flexibility, and has excellent withstand voltage characteristics after thinning, and may maintain solder heat resistance and characteristics of, for example, plastic substrate and conductive layer, to effectively solve the issues existing in the prior art.

What is claims is:

1. A curable composition for inkjet, comprising:
   a soluble polyimide resin;
   a photocurable acrylate compound comprising a difunctional (meth)acrylate compound containing an alkylene chain or an alkoxy chain, a bisphenol epoxy (meth)acrylate compound, and a (meth)acrylate compound having a hydroxyl group;
   a photopolymerization initiator; and
   a thermosetting resin,
   wherein the soluble polyimide resin is dissolved in a difunctional (meth)acrylate compound containing the alkylene chain or the alkoxy chain,
   wherein a solid content of the soluble polyimide resin dissolved in the difunctional (meth)acrylate compound containing the alkylene chain or the alkoxy chain accounts for 1 wt % to 40 wt % of the difunctional (meth)acrylate compound containing the alkylene chain or the alkoxy chain.

2. The curable composition for inkjet of claim 1, wherein an intrinsic viscosity of the soluble polyimide resin is 0.1 to 0.8.

3. The curable composition for inkjet of claim 1, wherein the soluble polyimide resin is polymerized from a dianhydride monomer and a diamine monomer having a molar ratio of 1:0.9 to 1:0.98.

4. The curable composition for inkjet of claim 1, wherein a viscosity of the curable composition for inkjet at a temperature of 50° C. is 50 mPa·s or less.

5. The curable composition for inkjet of claim 1, wherein the soluble polyimide resin is composed of a monomer represented by a chemical structure of formula 1 and a fluorine-containing monomer, formula 1

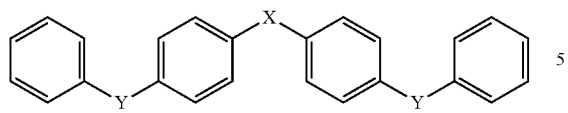

in formula 1, X is $SO_2$, $C(CH_3)_2$, or $C(CF_3)_2$, and Y is an oxygen atom.

6. The curable composition for inkjet of claim 5, wherein the fluorine-containing monomer comprises 4,4'-(hexafluoroisopropylidene) diphthalic anhydride, bis (trifluoromethyl) benzidine, 2,2'-bis (3-aminophenyl) hexafluoropropane, 2,2'-bis (4-aminophenyl) hexafluoropropane, 2,2-bis (3-amino-4-hydroxy-phenyl)-hexafluoropropane, or 2,2'-bis (trifluoromethyl)-4,4'-diaminodiphenyl ether.

7. The curable composition for inkjet of claim 5, wherein the monomer represented by the chemical structure of formula 1 and the fluorine-containing monomer account for 50% or more of total moles of a dianhydride monomer and a diamine monomer.

8. A cured product, obtained by curing the curable composition for inkjet of any of claims 1 to 4 or 5-7.

9. A flexible printed circuit board, comprising the cured product of claim 8.

10. The flexible printed circuit board of claim 9, wherein a thickness of the cured product located at a surface of the flexible printed circuit board is 15 μm, and the cured product has no cracks after bending at an angle of R=3 mm and 10,000 times of bending tests.

* * * * *